(12) United States Patent
Metzmacher et al.

(10) Patent No.: US 8,721,778 B2
(45) Date of Patent: May 13, 2014

(54) FOIL TRAP DEVICE WITH IMPROVED HEAT RESISTANCE

(75) Inventors: Christof Metzmacher, Rearen (BE); Michael Schaaf, Herzogenrath (DE); Peter Klaus Bachmann, Wuerselen (DE)

(73) Assignee: Koninklijke Philips N.V., Eindhoven (NL)

( * ) Notice: Subject to any disclaimer, the term of this patent is extended or adjusted under 35 U.S.C. 154(b) by 19 days.

(21) Appl. No.: 13/395,450

(22) PCT Filed: Sep. 14, 2010

(86) PCT No.: PCT/IB2010/054129
§ 371 (c)(1),
(2), (4) Date: May 11, 2012

(87) PCT Pub. No.: WO2011/033447
PCT Pub. Date: Mar. 24, 2011

(65) Prior Publication Data
US 2012/0216681 A1    Aug. 30, 2012

(30) Foreign Application Priority Data
Sep. 18, 2009  (EP) .................................. 09170710

(51) Int. Cl.
*B01D 49/00*  (2006.01)
*G03F 7/20*  (2006.01)

(52) U.S. Cl.
CPC ........ *G03F 7/70916* (2013.01); *G03F 7/70166* (2013.01); *G03F 7/70883* (2013.01); *G03F 7/70958* (2013.01); *G03F 7/70983* (2013.01); Y10S 977/778 (2013.01)
USPC ............................................. 96/392; 977/778

(58) Field of Classification Search
CPC ............ G03F 7/70166; G03F 7/70883; G03F 7/70916; G03F 7/70958; G03F 7/70983
USPC .............................................. 96/392; 977/778
See application file for complete search history.

(56) References Cited

U.S. PATENT DOCUMENTS

| 2004/0108473 | A1 | 6/2004 | Melnychuk et al. | |
|---|---|---|---|---|
| 2004/0178365 | A1* | 9/2004 | Rice ........................... | 250/492.2 |
| 2006/0145094 | A1* | 7/2006 | Wilhelmus Van Herpen et al. .......................... | 250/492.2 |
| 2006/0261290 | A1 | 11/2006 | Van Herpen et al. | |

FOREIGN PATENT DOCUMENTS

WO        2010015508 A2    2/2010

* cited by examiner

Primary Examiner — Christopher P Jones
(74) Attorney, Agent, or Firm — Mark L. Beloborodov

(57) ABSTRACT

The present invention relates to a foil trap device for debris mitigation, in particular in an EUV system. The foil trap comprises a plurality of spaced apart foils (4) extending from an entrance side towards an exit side of the foil trap, said foils (4) being arranged to allow a straight pass of radiation between the entrance side and the exit side. The foils (4) are coated at least at entrance side edges with a layer (8, 11) of a carbon material containing a fraction of at least 60% of sp3-hybridized carbon atoms, or with a layer (8, 11) of carbon nanotubes. As an alternative, the foils (4) are made of a bulk carbon material of the above composition. The proposed foil trap offers the combination of a high thermal conductivity, a high thermo-chemical resistance against Sn and other liquid metals and a high mechanical stiffness.

7 Claims, 2 Drawing Sheets

FOIL TRAP DEVICE WITH IMPROVED HEAT RESISTANCE

FIELD AND BACKGROUND OF THE INVENTION

The present invention relates to a foil trap device for debris mitigation comprising a plurality of spaced apart foils extending from an entrance side towards an exit side of the foil trap device, said foils being arranged to allow a straight pass of radiation between the entrance side and the exit side of the foil trap device.

In systems with extreme ultraviolet (EUV) and/or soft X-ray radiation optical components such as mirrors or filters are in use which are arranged close to the high power light source. Both, optical components and light source, are in vacuum or least at a very low pressure level (typically 1 to 100 Pa) in order to minimize the absorption of the target radiation to be exploited. The present invention in particular relates to such EUV lithography systems.

In general, the light source, e.g. a pulsed plasma light source, is not merely emitting photons but also producing undesired material, so called debris, such as for example Sn, Li, Sb or Xe depending on the nature of the source itself. The debris defined in this sense may condense on the optical components whose performance consequently deteriorates, and a status may result, in which the optical component is inefficacious after a relatively short time. Due to the high plasma temperature a part of this debris consists of very fast ions and atoms in the keV range of energy. Apart from the very fast debris material not considered here also remarkably high amounts of slower atoms, ions and material droplets as well as particles are to be expected along the optical ray path. This type of debris is detrimental to the properties, e.g. EUV reflectivity, of the optical components, mainly due to deposition of material on the surface of the optical components. It is estimated that without any protection the lifetime of the optical components only due to deposition of material will be less than $10^4$ shots of the pulsed light source. End of lifetime is defined by a 10% EUV reflectivity loss of each mirror component in use.

In order to protect the optical components from contaminating debris material in the aforementioned sense, in state of the art EUV lithography systems, in particular in the source containing devices, usually a so called foil trap is implemented. The foil trap is a debris mitigation tool that is located between the EUV light source and the optical components. The foil trap consists of a plurality of thin foils, also called blades or lamellas, with a thickness of e.g. 0.25 mm. These foils are typically arranged in parallel or in a radial way and spaced apart from each other by for example 1 mm, becoming larger at the outer circumference in case of a radial arrangement. A foil trap having the foils radially arranged with respect to a rotational axis may be operated with high rotational frequencies to trap high velocity particles. Such a foil trap is disclosed for example in WO 2006/134512 A2. In addition, the device is generally applied with an inert buffer gas. This leads to a deceleration of particles and material, and in conjunction with e.g. a rotational motion of the foils around the rotational axis, contaminants are collected on the walls of the foils of the trap and thus cannot reach the optical components. In EUV radiation systems with a wavelength of 13.5 nm mainly Argon is used as buffer gas, because it is an optimum compromise between effective deceleration of particles and absorption losses of EUV radiation. Other gases such as for example He, Ne or Kr, can be used, too. A large variety of foil trap designs based on the mentioned principles exist. All are designed for high EUV radiation throughput.

One disadvantage of current foil traps relates to the future perspective of high thermal loads expected in upcoming generations of EUV sources, especially of high-volume production tools for EUV lithography. It can be foreseen that the contaminant trapping device has to deal with several kW of heat at dedicated regions of the device. This is due to the ever increasing input power of several ten kW in future systems and thus, a corresponding increased demand in heat dissipation. The heat fraction stored in and delivered by particles and radiation probably may sum up to as high as 50% of the input energy. It is thus clear that the optical components as well as the foil trap have to be designed properly to be able to withstand this energy input. The heat load to the foil trap has a geometric dependence on design originating from azimuthal and radial distances to the EUV source delivering the heat. Furthermore, the heat conduction of the foil trap is dependent on the number and thickness of the foils but also on the heat conductivity and heat diffusivity of the material of the foils at elevated temperatures of e.g. 800 K or more. It is not straightforward that current and future designs applying current state of the art materials may result in systems being capable of dealing with these high temperatures and fulfill dedicated heat dissipation schemes in order to guarantee a stable and continuous operation and a long lifetime.

Another disadvantage of most current foil traps refers to the thermo-chemical properties of the materials in use. In all state of the art systems the materials of choice are preferably metals like copper, tantalum, molybdenum, tungsten or steel. The problem is that at elevated temperatures every oxide-free metal or alloy will likely react with the still hot Sn delivered from a Sn based plasma light source towards the foil trap. This chemical reaction, also considered as a form of corrosion by Sn, will deteriorate the properties of the metal based foil trap. As long as there is no saturation effect of reaction, the foil trap material will dissolve completely and thus lead to the total failure of the debris mitigation. Ceramic materials may be a solution for this problem. However, these ceramic materials suffer from the problem to deal with the above mentioned high thermal loads, as they usually exhibit only a very low thermal conductivity. A further possibility is to use foil traps made of a carbon-fibre composite material, as described in WO 2009/035328 A1. The carbon-fibre composite material provides a higher resistance against Sn.

SUMMARY OF THE INVENTION

It is an object of the present invention to provide a foil trap device, in particular for debris mitigation in systems generating EUV and/or soft X-ray radiation, which has a high thermal conductivity, a high thermo-chemical resistance against Sn and a high mechanical stiffness, all at elevated temperatures.

The object is achieved with the foil trap device according to claim 1. Advantageous embodiments of this foil trap device are subject matter of the dependent claims or are disclosed in the subsequent portions of the description.

The proposed foil trap device for debris mitigation comprises a plurality of spaced apart foils extending from an entrance side towards an exit side of the foil trap device, said foils being arranged to allow a straight pass of radiation between the entrance side and the exit side. The foils, which are preferably made of a metal, are coated at least at entrance side edges with a layer of a carbon material containing a fraction of at least 60% of $sp^3$-hybridized carbon atoms, preferably with a ratio of $sp^3/sp^2$ bonds of >60%, or with a layer of carbon nanotubes. As an alternative, the foils may also be made completely of a bulk carbon material of the above composition. The above values relate to the ternary phase diagram of $sp^3$-C, $sp^2$-C and H.

The arrangement and number of foils of the foil trap as well as the overall construction of this foil trap device can be selected as known in the art. This means that the foil trap may comprise for example a plurality of parallel foils or a plurality of foils radially extending from a central rotational axis. The foil trap may also comprise several groups of foils arranged one behind the other between the entrance side and the exit side of the foil trap, whereas the single groups may be rotatable around a central rotational axis or static or a combination of both. The present invention is not limited to the special construction and arrangement of the foils of the foil trap.

The foil trap is preferably arranged in systems applying EUV sources, in EUV source-collector modules or in EUV lithography systems in general.

The idea of this invention is based on the exploitation of the outstanding thermal capabilities of carbon materials, such as thermal stress, coefficient of thermal expansion (CTE), thermal conductivity, thermal diffusivity, thermal heat capacity, and thermal shock resistance. It is also based on the excellent chemical and corrosion resistance properties of these materials. With the use of a carbon material containing at least 60% of $sp^3$-hybridized carbon atoms, the above object at elevated temperatures to which a foil trap is exposed is achieved. The same applies to the proposed coating of at least the entrance side edges of the foils with a layer of carbon nanotubes. These proposed measures provide a high thermal conductivity and a high thermo-chemical resistance against Sn as well as a high mechanical stiffness. Instead of coating only the entrance side edges of the foils, also larger regions or the whole surface of the foils can be coated with the above materials. The foils may also be made completely of a bulk carbon material having a content of at least 60% of $sp^3$-hybridized carbon atoms in order to achieve the above object.

In the bonding of carbon solids microstructure $sp^1$, $sp^2$ and $sp^3$ bonding may principally coexist. Thermodynamically, the $sp^2$ bonds (e.g. graphite) are more stable at room temperature when compared to the $sp^3$-hybridization (e.g. diamond), with $sp^1$ bonds not contributing significantly to the properties. From the nature of bonding it is straightforward, that the more $sp^3$ bonds are present, the closer the properties of the pure carbon solid approach those of diamond. Consequently, the ratio of $sp^3/sp^2$ bonds has a strong influence on the properties of the carbon based material in general and is best illustrated by the considerable differences in the properties of graphite and diamond. A method to analyze the $sp^3/sp^2$ ratio in a carbon solid is Raman spectroscopy.

In the literature the terms diamond, ultra-nanocrystalline diamond, nano-diamond, diamond-like carbon (DLC), tetrahedrally coordinated amorphous carbon (taC) and diamond-like amorphous carbon (DAC) are used to describe an entire class of polycrystalline, mixed phase materials or amorphous carbon phases which correspond to the carbon material used with the present invention. DLC is sometimes considered an ultra-nanocrystalline thin diamond, sometimes a diamond-like carbon film. The corresponding microstructures can be controlled by growth processes with and without hydrogen. Being more precise here, the name taC refers to the class of materials with a high $sp^3/sp^2$ ratio of e.g. >60%, resulting in relevant phases in the $sp^3$ rich, hydrogen-poor vertex of the ternary phase diagram of $sp^3$-C, $sp^2$-C and H. This may comprise true nanocrystalline diamond phases but also amorphous (noncrystalline), hydrogen-free carbon phases with nevertheless more than 80% $sp^3$ bonds. It is one basic thought of the present invention that a material that contains a greater percentage of the diamond phase is more capable to fulfill the required thermal conditions than especially other carbon phases, any other material in general and also the materials currently used in the state of the art. Regarding EUV application limited amounts of hydrogen in the layer will not be detrimental.

Composition and properties of the carbon containing phases depend strongly on the preparation conditions. The deposition of the materials can be performed by standard techniques, e.g. by means of physical or especially for diamond-rich phases chemical vapour deposition (PVD and CVD, respectively). In particular the CVD gas phase composition is important. The presence of O or N in the CVD gas phase leads to the formation of non-diamond material and restricts the thermal diffusivity to values below $6 \cdot 10^{-4}$ $m^2/s$. Isotopically enriched $^{12}C$-diamond layers may exhibit a thermal conductivity 20 to 50% higher than that of natural phase-pure diamond and may therefore be advantageous, $^{13}C$ in the solid reduces the thermal diffusivity by 30%.

Carbon materials have the advantage to be corrosion resistant to liquid Sn. In particular, at the high temperatures aimed at in this invention, the diamond-containing carbon compounds as well as amorphous diamond films offer higher chemical stability than reached by conventional materials such as copper, steel or molybdenum.

In case of coating the foils with the proposed carbon material or carbon nanotubes, the base material of the foils is preferably a metallic material as known in the art. In a preferred embodiment, a metal such as W, Ta, Ti or Zr is used as the base material of the foils. These materials have the advantage that metal carbides are synthesized at the interface of the carbon material and the metal by a dedicated vacuum annealing process. This leads to a very good adhesion of the carbon material to the foil and allows choosing an appropriate basic foil material with other properties than in current systems, for example to lower the weight of the foil.

BRIEF DESCRIPTION OF THE DRAWINGS

The proposed foil trap is described in the following by way of example in connection with the accompanying figures without limiting the scope of protection as defined by the claims. The figures show:

DETAILED DESCRIPTION OF EMBODIMENTS

Figure 1:
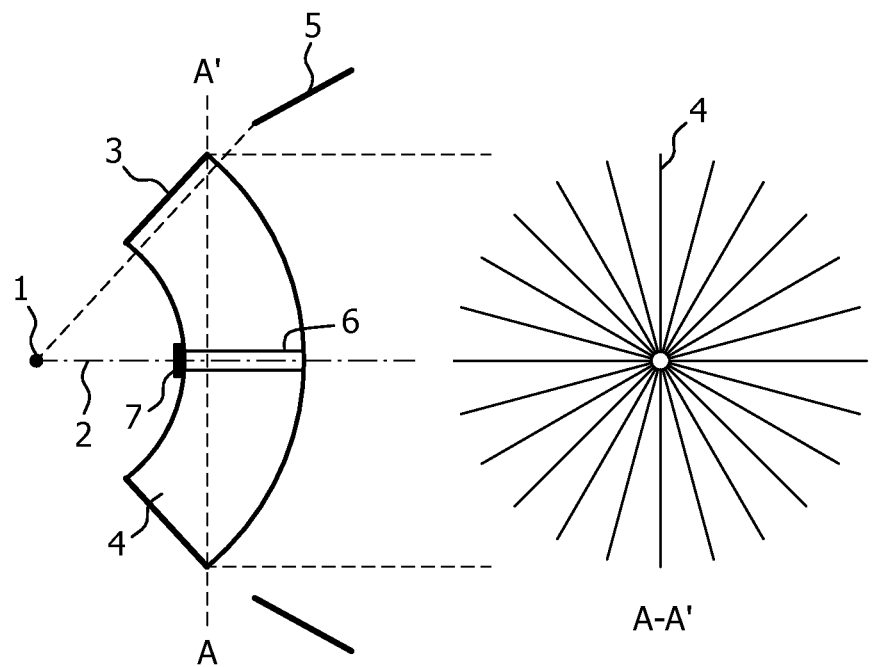
FIG. 1 an example of the construction of a foil trap in a schematic side and front view.

FIG. 1 shows an exemplary construction of a foil trap according to the present invention in a schematic side view on the left hand side and a front view on the right hand side. The foil trap has a rotating design in which the foils 4 radially extend from a rotation axis 6 to an outer ring 3 serving as a mounting fixture. The foil trap is arranged between the EUV plasma source 1 and an optical component 5 of the EUV system. The optical component 5 may be a collector mirror, for example, as known in the art. The rotation axis 6 of the foil trap is arranged on the optical axis 2 of the EUV system. A heat shield 7 protects the rotation axis 6. EUV radiation emitted from EUV plasma source 1 can pass the foil trap on a straight path between the single foils 4 of the foil trap extending between the entrance side and the exit of the foil trap. By rotating this foil trap around the rotation axis 6, debris particles are trapped by the foils 4 and cannot reach the optical component 5.

In one embodiment of the proposed foil trap a carbon material containing a substantial amount of $sp^3$-hybridized carbon atoms and a relatively low amount of hydrogen is used as a top film material on the foils 4 of the foil trap. This class of carbon materials offers a strikingly higher thermal conductivity ($\lambda$) than for example molybdenum or tungsten in the relevant range of temperatures. Top-quality material of CVD diamond can have a $\lambda$ of about 700 W/(mK) at 800K, which is still approx. twice the value for Cu or Ag and more than a factor of 5 better than for Mo or W. The thickness of the layer of the so defined class of carbon materials is in the range of 1 to 10 μm to achieve high values of thermal conductivity and diffusivity.

A critical issue in thin film deposition is related to the differences in linear expansion of the film and substrate material which may result in too high stresses and failure of film adhesion. The thermal expansion coefficients of carbon materials and Mo are similar which is advantageous for the deposition of carbon materials on Mo.

Figure 2:
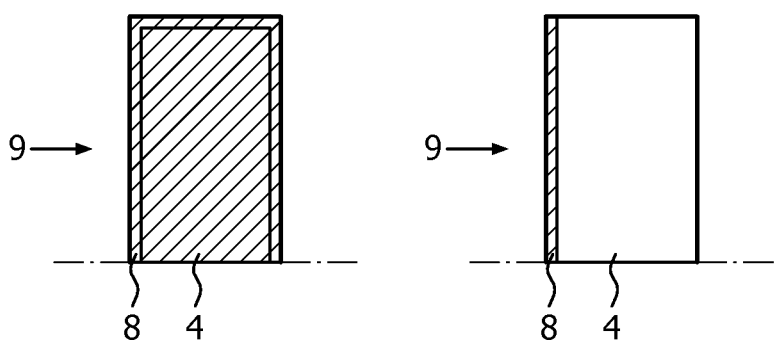
FIG. 2 a schematic view of two configurations of coated foils of the foil trap.

FIG. 2 shows two examples of the coating of the foils 4 of the foil trap with a layer of such a carbon material, in particular a DLC layer 8. In the left hand example the deposition of the carbon material is maintained on all surfaces of the foil 4 which leads to a further relaxation of the stress situation. Another advantage of this embodiment is the roughening of the surface of the foils 4 by deposition of carbon material which results in an improved effectiveness of the material filter function as more debris particles are trapped. In the example on the right hand side of FIG. 2, the DLC layer 8 is only deposited on the front edge of the foil 4, i.e. on the region of the foil directed towards the EUV light source (entrance side of the foil trap). This is the most prominent region as it is directly oriented to the EUV pinch and may suffer most from normal incidence of EUV light 9 and thus heat.

In another embodiment of the proposed foil trap, the so defined class of carbon material as in the previous embodiment is used in combination with different basic foil materials which serve as a substrate material during carbon material deposition. As already stated above, carbon materials are resistant to liquid Sn corrosion as deduced from own investigations. However, it is worth noting that carbon materials can be attacked chemically by metals such as W, Ta, Ti or Zr to form the respective carbides at high temperatures. In the present embodiment, this is achieved intentionally by a dedicated vacuum annealing process where the metal carbides are synthesized at the (former) interface of carbon material and metal. This leads to the advantages that firstly, a very good adhesion of the carbon layer is achieved and secondly, an appropriate basic foil material with better properties than in current systems can be selected. One example is the choice of titanium which is a low weight material, thus the total weight of the foil trap can be reduced significantly. Another example is given by tungsten which has a even lower coefficient for thermal expansion than Mo and is thus advantageous to compensate for the potentially high compressive intrinsic stress of amorphous carbon films.

Figure 3:
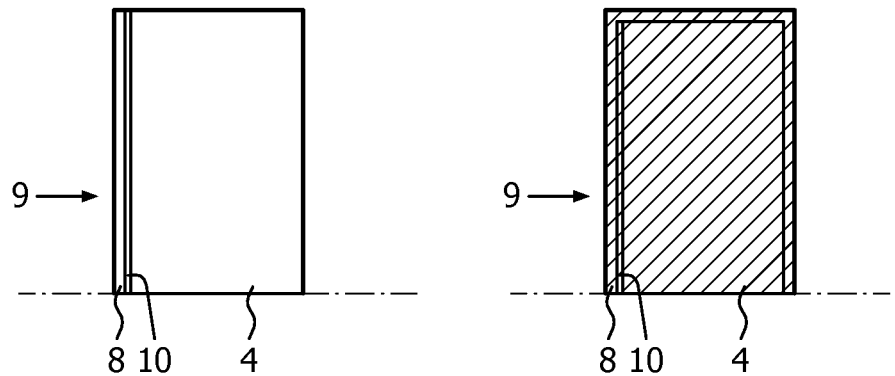
FIG. 3 a schematic view of two further configurations of coated foils of the foil trap, and FIG. 4 a schematic view of a configuration of a foil coated with a layer of carbon nanotubes.

Two possible configurations of such an embodiment are shown in FIG. 3. On the left hand side of this figure, the foil 4 is made of W and a DLC layer 8 is deposited on the front edge (entrance side edge) of the foil 4. An annealing process is then performed to form a WC layer as an intermediate layer 10 at the interface between the DLC layer 8 and the W base material of the foil.

The right hand side shows an example in which the basic foil material is Ti. Also in this case an intermediate layer of TiC is formed between the deposited DLC layer 8 and the basic foil material by an annealing process. The intermediate layer 10 is only schematically indicated in this figure, in which the whole surface of the foil 4 is coated with the carbon material.

It is important to note that materials such as and containing Fe, Co, Mn, Ni, Cr and the Pt group elements are solvents for carbon, promote the (catalysed) graphitization of diamond and thus shall not be used in the sense of this idea unless an appropriate barrier layer, e.g. TiN is used between the metal and the carbon layer.

In another embodiment of the proposed foil trap the class of carbon materials in the above defined sense are used as a bulk material of the foils 4 of the foil trap, i.e. the foils 4 themselves are manufactured completely from this carbon material. The thermal diffusivity and thermal conductivity of CVD diamond films increase with increasing thickness from 2 to 200 μm. The saturation level of about 2200 W/(mK) at room temperature is reached for thickness values larger than about 200 μm. It is state of the art to produce such free-standing configurations from CVD-diamond wafers with thickness values between 50 μm and beyond 2 mm. As with large diamond grains (>20 μm), which provide high thermal capabilities, this idea has the advantage of a further improvement of the thermal conductivity to room temperature values of about 1800 W/(mK) at a reasonable foil thickness of 50 to 200 μm compared to state of the art non diamond layers.

It is worth noting that nowadays stresses are merely a minor issue of amorphous carbon films which can be synthesized with, simultaneously, a $sp^3/sp^2$ ratio >60% and a film thickness of more than 100 nm. Furthermore, in order to prevent the system from high mechanical stress, the foils (metal or carbon material based) are usually slidably connected into grooves of the inner and/or outer rings or mounting fixtures. Thus, mechanical issues are generally of minor importance.

A further advantage of this embodiment is that due to the very low weight and high tensile strength of carbon materials compared to any other metal based foils, the total weight of the foil trap can be reduced and the rotational part can be driven with higher speed resulting in an improved filter function. Another advantage is the possibility to choose thinner foils than in state of the art systems, because higher thermal conductivities without loosing mechanical stability are reachable. This allows for a higher optical transmission and thus improved EUV performance.

Figure 4:
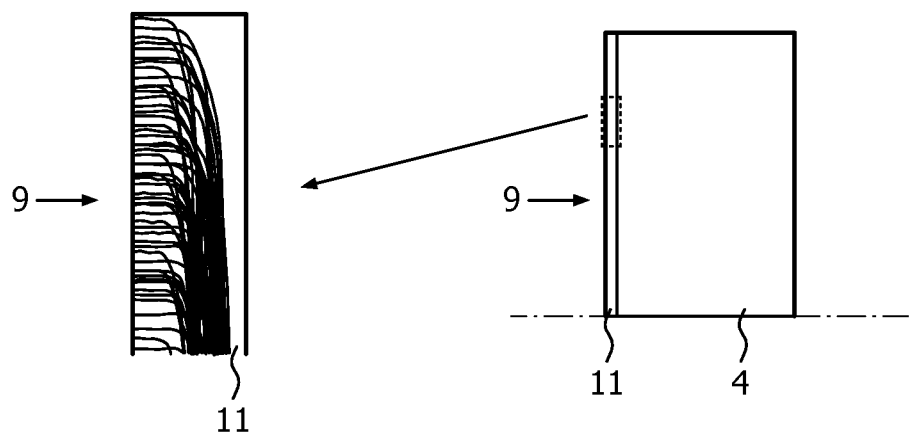

In another embodiment of the proposed foil trap, carbon nanotubes (CNT) are used as a top film material on the foils 4 of a foil trap. CNT or buckytubes are fibre polymers of carbon with an extremely high thermal conductivity along their tube axis. It is reported that room temperature values as high as 6600 W/(mK) deduced from theoretical studies and >3000 W/(mK) measured experimentally with a single carbon nanotube can be reached. Along with the chemical resistance, high stiffness and toughness of the fibres, this material is also very promising to be suited as a film material deposited on a foil of a foil trap system. According to this and in order to exploit the thermal capabilities most effectively, the CNTs have to be closely packed and aligned on the foils as schematically shown on the left hand side of FIG. 4 as one example. In this figure on the right hand side the CNT layer 11 is coated to the front edge (entrance side edge) of the foil 4. The left hand side schematically shows an enlarged view of this coating and the alignment of the nanotubes in this layer 11.

While the invention has been illustrated and described in detail in the drawings and forgoing description, such illustration and description are to be considered illustrative or exemplary and not restrictive. The invention is not limited to the disclosed embodiments. The different embodiments described above and in the claims can also be combined. Other variations to the disclosed embodiments can be understood and effected by those skilled in the art in practicing the claimed invention, from the study of the drawings, the disclosure and the appended claims. For example, the construction of the foil trap is not limited to a single-stage foil trap as described with respect to FIG. 1. Also other arrangements of the foils are possible. Furthermore, the foils may also have a different design.

In the claims, the word "comprising" does not exclude other elements or steps, and the indefinite article "a" or "an" does not exclude a plurality. The mere fact, that the measures are recited in mutually different dependent claims does not indicate that a combination of these measures cannot be used to advantage. The reference signs in the claims should not be construed as limiting the scope of these claims.

LIST OF REFERENCE SIGNS

1 EUV plasma source
2 Optical axis
3 Mounting fixture
4 Foil
5 Optical component
6 Rotation axis
7 Heat shield
8 DLC layer
9 EUV light
10 Intermediate layer
11 CNT layer

The invention claimed is:

1. A foil trap device for debris mitigation comprising a plurality of spaced apart foils extending from an entrance side towards an exit side of the foil trap device, said foils being arranged to allow a straight pass of radiation between the entrance side and the exit side, wherein the foils are coated at least at entrance side edges with a layer of a carbon material containing a fraction of at least 60% of sp3-hybridized carbon atoms, or with a layer of carbon nanotubes, or comprise a bulk carbon material containing a fraction of at least 60% of sp3-hybridized carbon atoms.

2. The device according to claim 1, wherein said layer of a carbon material contains a ratio of sp3/sp2 bonds of >60%.

3. The device according to claim 1, wherein the foils comprising a base material selected from the group consisting of: Mo, steel, Cu, W, Ta, Ti and Zr.

4. The device according to claim 3, wherein said foils comprise an intermediate carbide layer formed between said layer of carbon material and said base material of the foils.

5. The device according to claim 1, wherein the foils are completely coated with said layer of carbon material or said layer of carbon nanotubes.

6. The device according to claim 1, wherein said layer has a thickness of between 1 μm and 10 μm.

7. The device according to claim 1, wherein the foils have a thickness of between 20 μm and 200 μm.

* * * * *